United States Patent
Kuo et al.

(10) Patent No.: US 11,678,443 B2
(45) Date of Patent: Jun. 13, 2023

(54) HANGING GROUNDED STRUCTURE

(71) Applicant: Delta Electronics, Inc., Taoyuan (TW)

(72) Inventors: Chun-Hung Kuo, Taoyuan (TW); Po-Heng Chao, Taoyuan (TW); Jui-Ching Lee, Taoyuan (TW); Do Chen, Taoyuan (TW); Ching-Ho Chou, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 101 days.

(21) Appl. No.: 17/492,882

(22) Filed: Oct. 4, 2021

(65) Prior Publication Data

US 2023/0048184 A1 Feb. 16, 2023

(30) Foreign Application Priority Data

Aug. 10, 2021 (CN) .......................... 202110914966.6

(51) Int. Cl.
*H01R 13/58* (2006.01)
*H05K 5/00* (2006.01)

(52) U.S. Cl.
CPC .................................. *H05K 5/0026* (2013.01)

(58) Field of Classification Search
None
See application file for complete search history.

(56) References Cited

U.S. PATENT DOCUMENTS

| 4,186,981 | A | | 2/1980 | Holton | |
|---|---|---|---|---|---|
| 5,064,386 | A | * | 11/1991 | Dale | H01R 13/74 |
| | | | | | 439/535 |
| 6,940,016 | B1 | * | 9/2005 | Cornett | H01F 27/06 |
| | | | | | 439/535 |
| 7,621,763 | B2 | | 11/2009 | Clark et al. | |
| 9,437,964 | B2 | * | 9/2016 | Hwang | H01R 13/5812 |
| 2011/0180319 | A1 | * | 7/2011 | Nagata | F16J 15/106 |
| | | | | | 174/668 |
| 2013/0271934 | A1 | * | 10/2013 | He | H05K 7/1491 |
| | | | | | 361/752 |
| 2014/0168905 | A1 | * | 6/2014 | Ko | H01R 9/2425 |
| | | | | | 361/728 |

(Continued)

FOREIGN PATENT DOCUMENTS

| CN | 209786327 U | 12/2019 |
|---|---|---|
| TW | M393084 U | 11/2010 |
| TW | M474277 U | 3/2014 |

*Primary Examiner* — Xanthia C Cunningham
(74) *Attorney, Agent, or Firm* — Kirton McConkie; Evan R. Witt

(57) ABSTRACT

A hanging grounded structure is disclosed and includes a housing, a recessed portion and a hanging groove. The housing includes an opening facing a first direction and a lateral wall extended along a second direction. The lateral wall has a top edge located at a periphery of the opening. The recessed portion is recessed inwardly on the lateral wall. The hanging groove is disposed on the lateral wall and located in the recessed portion. A grounded wire is hung on the housing through the hanging groove. The hanging groove includes a starting point located at the top edge and an ending point. A curved path is formed from the starting point to the ending point. The grounded wire is hung from an interior of the housing. An end of the grounded wire is disposed in the recessed portion through the hanging groove.

18 Claims, 16 Drawing Sheets

(56) References Cited

U.S. PATENT DOCUMENTS

| | | | |
|---|---|---|---|
| 2015/0216065 A1* | 7/2015 | Chai | B23P 15/00 |
| | | | 361/679.01 |
| 2018/0177063 A1* | 6/2018 | Chen | H05K 9/0064 |
| 2020/0093018 A1* | 3/2020 | Chou | H05K 5/061 |
| 2020/0221600 A1* | 7/2020 | Chou | H05K 5/0217 |
| 2020/0318824 A1* | 10/2020 | Lee | F21V 19/0015 |

* cited by examiner

# HANGING GROUNDED STRUCTURE

FIELD OF THE INVENTION

The present disclosure relates to a grounded structure, and more particularly to a hanging grounded structure for simplifying the hanging procedure of the grounded wire, ensuring that the grounded wire meets the hanging requirements, keeping the grounded wire stable, and preventing the grounded wire from falling off.

BACKGROUND OF THE INVENTION

The use of the term ground is so common in electrical and electronics applications. While the circuit in the electronic device is grounded, a large conductor is usually attached to one side of the power supply (such as the "ground plane" on a printed circuit board) and served as the common return path for current from many different components in the circuit. In addition, a conventional hanging grounded structure is implemented by hanging the grounded wire on the metal housing.

A fastening screw or a pressing jig is used in the conventional hanging grounded structure of the grounded wire and the metal housing, so as to fasten the grounded wire on the metal housing and achieve the grounding. When the fastening screw is used to fasten the grounded wire in the hanging grounded structure, the material of the screw is added, so that the material cost is increased. Moreover, an additional production man-hour for fastening the screw is required. It is difficult to achieve the automatically hanging procedure. In addition, when the pressing jig is used to press the hanging grounded structure tightly, the hanging grounded structure has to be fit with the special jig, so as to meet the fastening requirement. In that, the material cost is increased, the procedure is complicated, the manufacturing cost is expensive, and it is difficult to achieve the automatically hanging procedure.

Therefore, there is a need of providing a hanging grounded structure to obviate the drawbacks encountered by the prior arts, simplify the hanging procedure of the grounded wire, ensure that the grounded wire meets the hanging requirements, keep the grounded wire stable, and prevent the grounded wire from falling off.

SUMMARY OF THE INVENTION

An object of the present disclosure is to provide a hanging grounded structure. With the hanging groove disposed in a slant arrangement, the procedure of hanging the grounded wire to the housing is simplified. The hanging groove is designed to include a plurality of sections in a curved path from the starting point to the ending point, and the slant direction is designed according to the hanging direction of the grounded wire, so as to ensure that the grounded wire meets the hanging requirements, keep the grounded wire stable, and prevent the grounded wire from falling off. In addition, the hanging groove is located in the recessed portion outside the housing, and forms the curved path from the starting point to the ending point. When the grounded wire is fixed to the hanging groove, an end of the grounded wire is exposed to an exterior of the housing through the hanging groove. It is convenient to confirm the hanging status of the grounded wire and the housing. On the other hand, after the top cover of the housing is assembled, the end of the grounded wire exposed to the recessed portion through the fixing section is at least partially exposed and uncovered by the top cover. The top cover includes a through hole spatially corresponding to the hanging groove. It is convenient for confirming the hanging status of the grounded wire and the housing. In addition, the top cover further includes a protrusion spatially corresponding to the hanging groove and the recessed portion, so that when the top cover of the housing is assembled, the protrusion abuts against the grounded wire in the recessed portion to ensure that the ground wire is limited and clamped in the recessed portion, keep the grounded wire stable, and prevent the grounded wire from falling off.

In accordance with an aspect of the present disclosure, a hanging grounded structure is provided and includes a housing, a recessed portion and a hanging groove. The housing includes an opening and a lateral wall. The opening faces a first direction, the lateral wall is extended along a second direction, and the first direction and the second direction are perpendicular to each other. The lateral wall has a top edge located at a periphery of the opening. The recessed portion is recessed inwardly from the housing and disposed on the lateral wall. The hanging groove is disposed on the lateral wall and located in the recessed portion. A grounded wire is allowed to be hung on the housing through the hanging groove. The hanging groove includes a starting point and an ending point, the starting point is located at a position of the top edge, and a curved path is formed from the starting point to the ending point. The grounded wire is hung on the hanging groove from an interior of the housing, and an end of the grounded wire is disposed in the recessed portion through the hanging groove.

In an embodiment, the housing includes an accommodation space, the accommodation space is configured to receive a printed circuit board, the accommodation space is in communication with an exterior of the housing through the opening and the hanging groove, and a fixed end of the grounded wire is connected to the printed circuit board.

In an embodiment, the hanging groove is slant compared to the top edge in the first direction and the second direction.

In an embodiment, the curved path of the hanging groove includes a first engaging section, a second engaging section and a fixing section arranged in sequence from the starting point to the ending point, wherein distances of the first engaging section, the second engaging section and the fixing section are sequentially increased relative to the top edge along the second direction.

In an embodiment, the first engaging section has a first spaced distance, the second engaging section has a second spaced distance, and the fixing section has a third spaced distance, wherein the first spaced distance and the second spaced distance are greater than the third spaced distance, respectively, wherein the grounded wire has a wire diameter, and the wire diameter is greater than each of the first spaced distance, the second spaced distance and the third spaced distance.

In an embodiment, the housing further includes a top cover spatially corresponding to the opening and the top edge, wherein when the top cover covers the opening and the top edge, the end of the grounded wire passed through the hanging groove and exposed to the recessed portion is at least partially exposed and uncovered by the top cover.

In an embodiment, the top cover further includes a through hole disposed on a lateral wall of the top cover and spatially corresponding to the hanging groove, wherein when the top cover covers the opening and the top edge, the grounded wire is partially exposed to an exterior of the housing through the through hole.

In an embodiment, the top cover further includes a protrusion disposed on a lateral wall of the top cover and spatially corresponding to the recessed portion and the hanging groove, wherein when the top cover covers the opening and the top edge, the protrusion abuts the end of the grounded wire passed through the hanging groove and exposed to the recessed portion.

In an embodiment, the housing includes a first engagement element, the top cover includes a second engagement element, and the first engagement element and the second engagement element are spatially corresponding to each other, wherein when the first engagement element is engaged with the second engagement element, the top cover is fastened on the housing.

In accordance with another aspect of the present disclosure, a hanging grounded structure is provided and includes a housing, a recessed portion and a hanging groove. The housing includes an opening and a lateral wall. The opening faces a first direction, the lateral wall is extended along a second direction, and the first direction and the second direction are perpendicular to each other. The lateral wall has a top edge located at a periphery of the opening. The recessed portion is recessed inwardly from the housing and disposed on the lateral wall. The hanging groove is disposed on the lateral wall and located in the recessed portion. A grounded wire is allowed to be hung on the housing through the hanging groove. The hanging groove is slant compared to the top edge in the first direction and in the second direction, and an end of the grounded wire is exposed to an exterior of the housing through the hanging groove.

In an embodiment, the housing includes an accommodation space, the accommodation space is configured to receive a printed circuit board, the accommodation space is in communication with an exterior of the housing through the opening and the hanging groove, and a fixed end of the grounded wire is connected to the printed circuit board.

In an embodiment, the hanging groove includes a starting point and an ending point, the starting point is located at a position of the top edge, and a curved path is formed from the starting point to the ending point, wherein the curved path of the hanging groove includes a first engaging section, a second engaging section and a fixing section arranged in sequence from the starting point to the ending point, and the opening located at the top edge is in communication with the fixing section through the first engaging section and the second engaging section, wherein the first engaging section, the second engaging section and the fixing section are misaligned in the first direction and in the second direction, wherein the grounded wire is hung on the fixing section from an interior of the housing, and the end of the grounded wire is exposed through the fixing section.

In an embodiment, distances of the first engaging section, the second engaging section and the fixing section are sequentially increased relative to the top edge along the second direction.

In an embodiment, the housing further includes a top cover spatially corresponding to the opening and the top edge, wherein when the top cover covers the opening and the top edge, the end of the grounded wire exposed to the recessed portion through the fixing section is at least partially exposed and uncovered by the top cover.

In an embodiment, the top cover further includes a through hole disposed on a lateral wall of the top cover and spatially corresponding to the hanging groove, wherein when the top cover covers the opening and the top edge, the grounded wire is partially exposed to an exterior of the housing through the through hole.

In an embodiment, the top cover further includes a protrusion disposed on a lateral wall of the top cover and spatially corresponding to the recessed portion and the hanging groove, wherein when the top cover covers the opening and the top edge, the protrusion abuts the end of the grounded wire passed through the fixing section and exposed to the recessed portion.

In an embodiment, the housing includes a first engagement element, the top cover includes a second engagement element, and the first engagement element and the second engagement element are spatially corresponding to each other, wherein when the first engagement element is engaged with the second engagement element, the top cover is fastened on the housing.

In an embodiment, the first engaging section has a first spaced distance, the second engaging section has a second spaced distance, and the fixing section has a third spaced distance, wherein the first spaced distance and the second spaced distance are greater than the third spaced distance, respectively, wherein the grounded wire has a wire diameter, and the wire diameter is greater than each of the first spaced distance, the second spaced distance and the third spaced distance.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
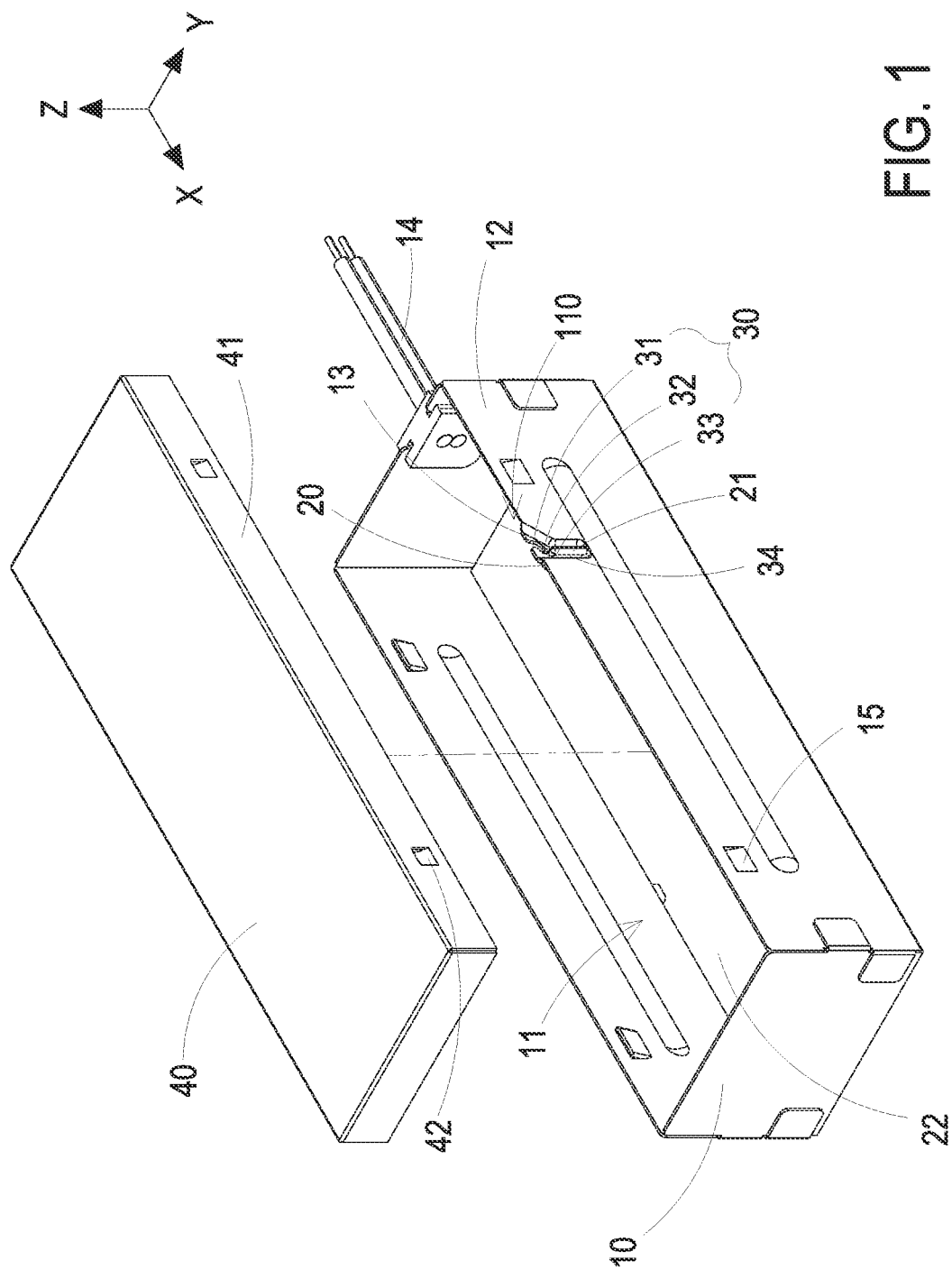
FIG. 1 is an exploded view illustrating a hanging grounded structure according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
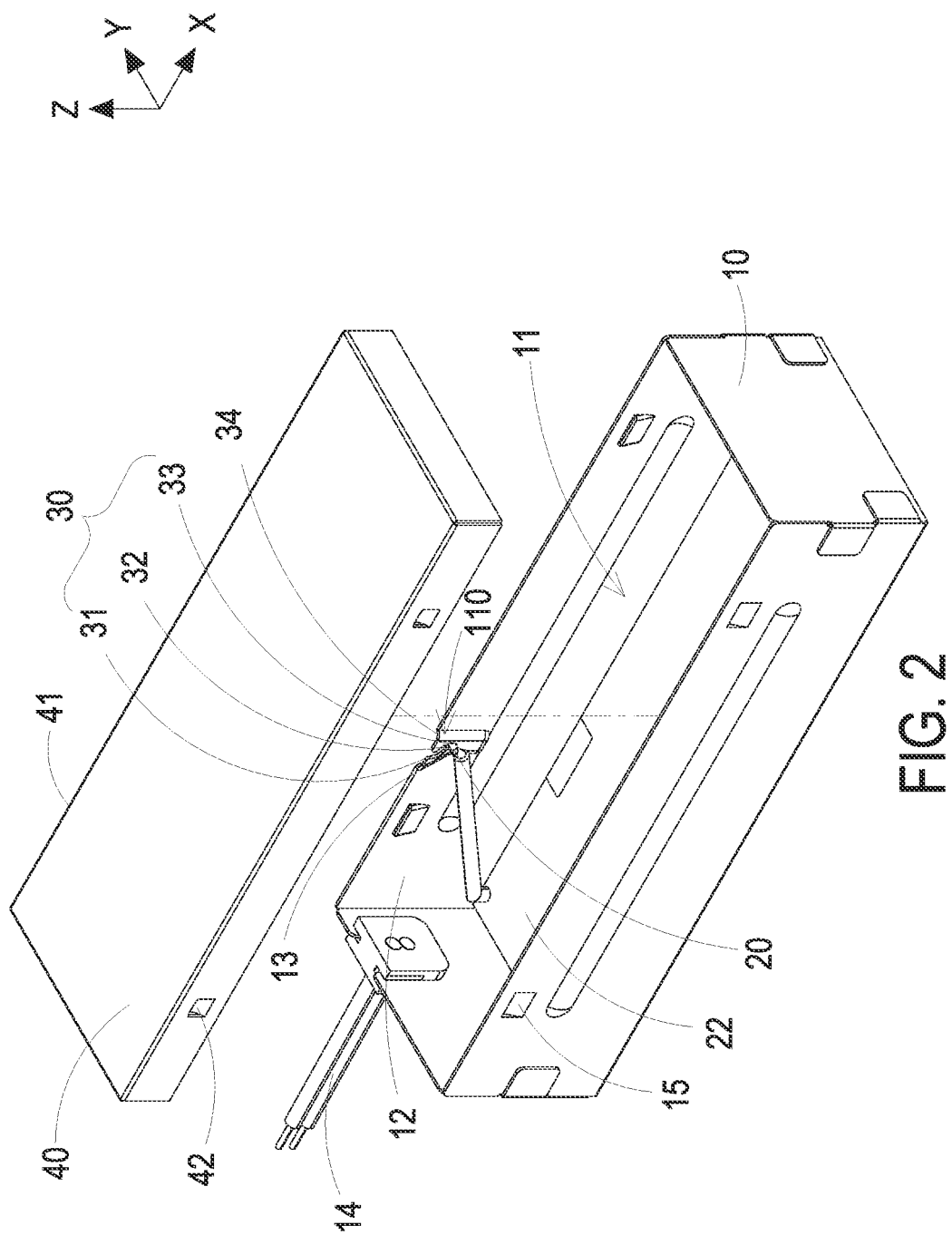
FIG. 2 is an exploded view illustrating the hanging grounded structure according to the first embodiment of the present disclosure and taken from another perspective.
Figure 3:
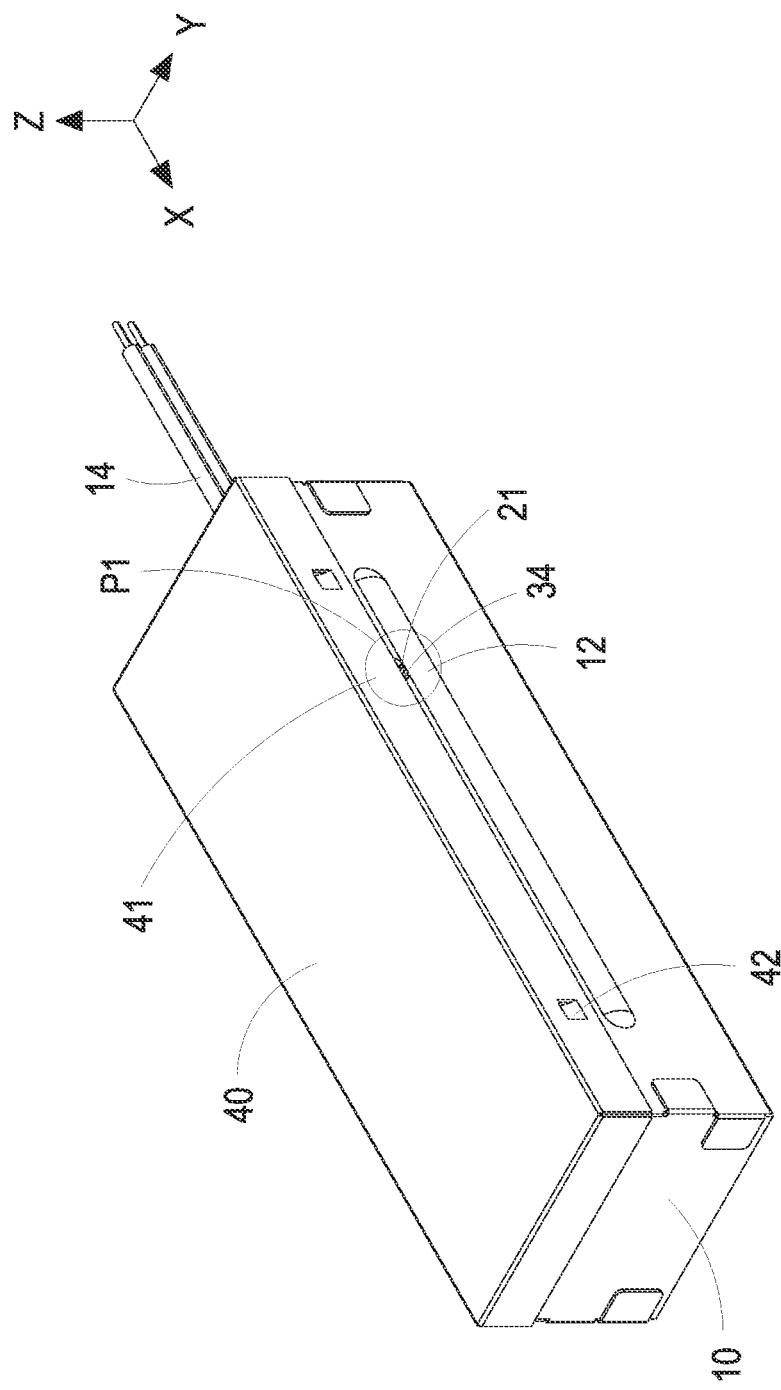
FIG. 3 is a schematic structural view illustrating the hanging grounded structure according to the first embodiment of the present disclosure.
Figure 4:
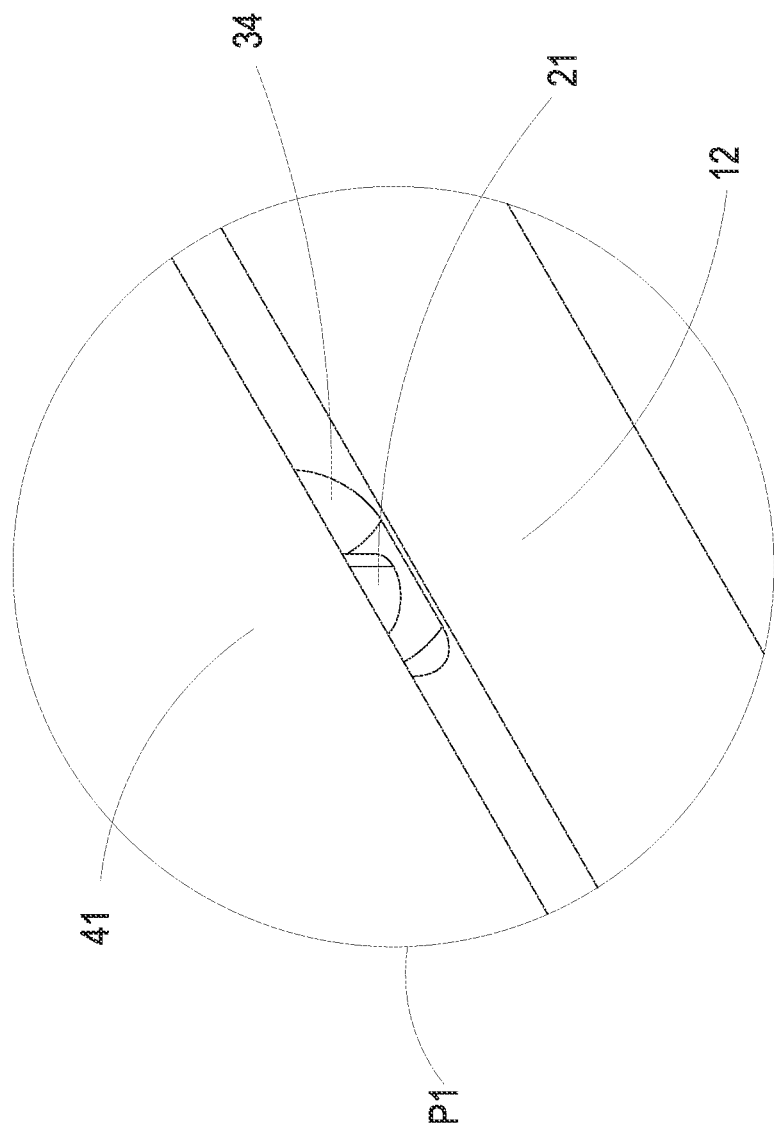
FIG. 4 is an enlarged view of the region P1 in FIG. 3.

FIGS. 1 and 2 are exploded views illustrating a hanging grounded structure according to a first embodiment of the present disclosure. FIG. 3 is a schematic structural view illustrating the hanging grounded structure according to the first embodiment of the present disclosure. FIG. 4 is an enlarged view of the region P1 in FIG. 3. In the embodiment, the hanging grounded structure (Hereinafter referred to as the grounded structure) 1 includes a housing 10, a recessed portion 34 and a hanging groove 30. Preferably but not exclusively, the housing 10 is made of a conductive metal material. The grounded structure 1 is used, for example, to allow an internal grounded wire 20 to be assembled with the housing 10. In the embodiment, the housing 10 includes an accommodation space 11, an opening 110 and a lateral wall 12. The accommodation space 11 is configured to receive a printed circuit board 22. In the embodiment, the accommodation space 11 is in communication with an exterior of the housing 10 through the opening 110 and the hanging groove 30. A fixed end of the grounded wire 20 is connected to the printed circuit board 22. The printed circuit board 22 is electrically connected to the exterior of the housing 10 through an external wire 14, but the present disclosure is not limited thereto. In the embodiment, the opening 110 faces a first direction, for example the Z-axis direction. The lateral wall 12 is extended along a second direction, for example the X-axis direction. The first direction and the second direction are perpendicular to each other. In the embodiment, the lateral wall 12 has a top edge 13, and the top edge 13 is located at a periphery of the opening 110. The recessed portion 34 is recessed inwardly from the housing 10 and disposed on the lateral wall 12 and the top edge 13. The hanging groove 30 is disposed on the lateral wall 12 and located in the recessed portion 34. The hanging groove 30 is configured to hang a grounded wire 20 led out from the printed circuit board 22, so as to form the grounded structure 1. In the embodiment, the hanging groove 30 includes a starting point S and an ending point E, the starting point S is located at a position of the top edge 13, and a curved path P is formed from the starting point S to the ending point E. In the embodiment, the curved path P of the hanging groove 30 includes a first engaging section 31, a second engaging section 32 and a fixing section 33 arranged in sequence from the starting point S to the ending point E. The opening 110 located at the top edge 13 is in communication with the fixing section 33 through the first engaging section 31 and the second engaging section 32. The first engaging section 31, the second engaging section 32 and the fixing section 33 are misaligned in the first direction (i.e. the Z-axis direction) and in the second direction (i.e. the X-axis direction). That is, the hanging groove 30 is slant compared to the top edge 13 in the first direction (i.e. the Z-axis direction) and the second direction (i.e. the X-axis direction), but not perpendicular to the Z-axis direction or the X-axis direction. In the embodiment, the grounded wire 20 is hung on the fixing section 33 of the hanging groove 30 from an interior of the housing 10, and an end 21 of the grounded wire 20 is exposed to the exterior of the recessed portion 34 through the fixing section 33 of the hanging groove 30. Notably, the grounded wire 20 can be grabbed by the manpower or the automated mechanical equipment, to cross the hanging groove 30 and keep the end 21 extending outside the housing 10. After that, the crossing point of the grounded wire 20 goes through the first engaging section 31 and the second engaging section 32 from top to bottom, and enters the fixing section 33 to be clamped and fastened. That is, the hanging procedure of the grounded wire 20 is completed. The end 21 of the grounded wire 20 is exposed to the exterior of the recessed portion 34 through the fixing section 33, so that it is convenient to confirm the hanging status of the grounded wire 20 and the housing 10.

Figure 5:
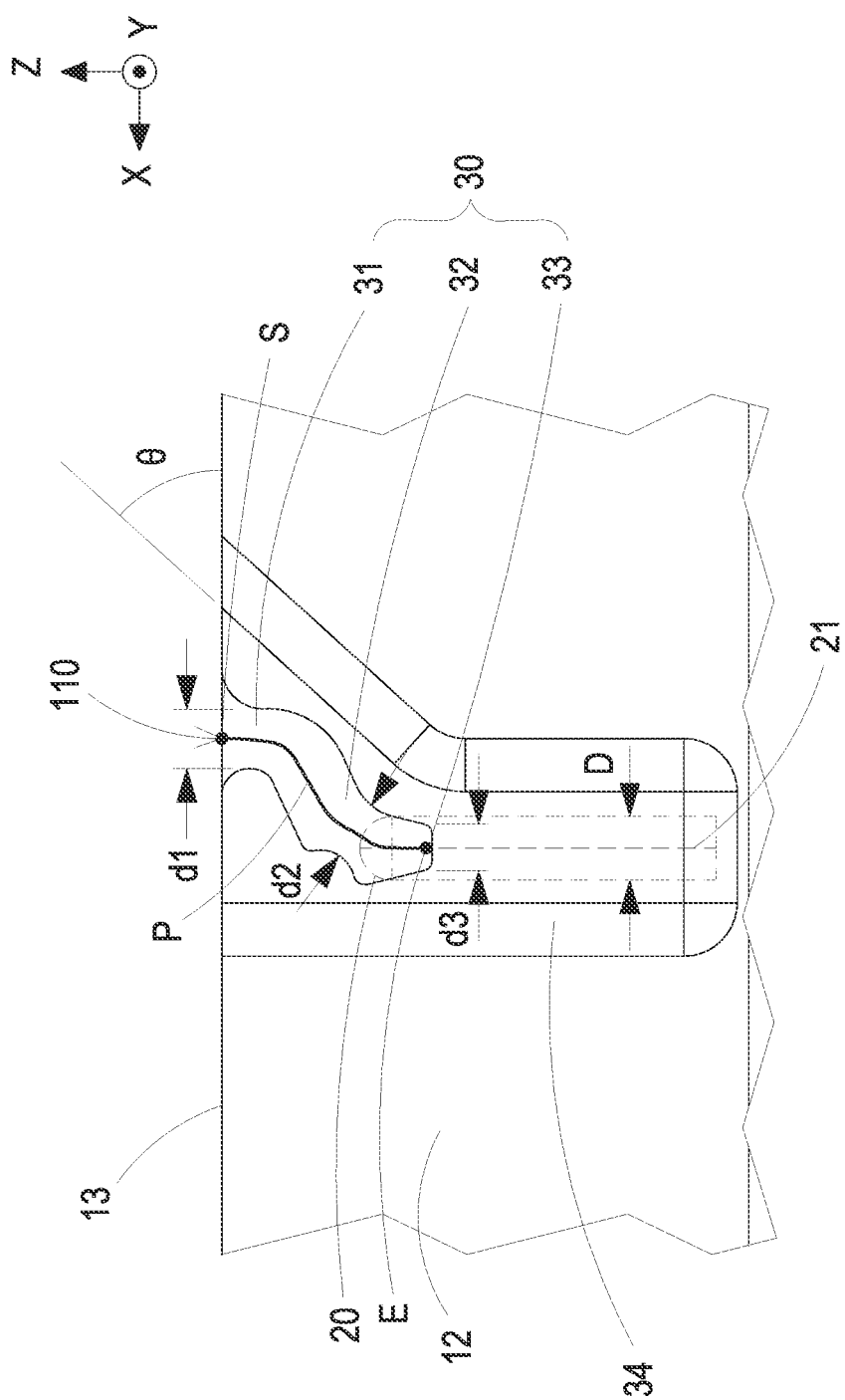
FIG. 5 is a schematic diagram showing the relative sizes of the three sections of the hanging groove of the hanging grounded structure according to the first embodiment of the present disclosure.

FIG. 5 is a schematic diagram showing the relative sizes of the three sections of the hanging groove of the hanging grounded structure according to the first embodiment of the present disclosure. As shown in FIGS. 1 to 5, the hanging groove 30 is slant compared to the top edge 13 of the lateral wall 12 of the housing 10 in the first direction such as the Z-axis direction and the second direction such as the X-axis direction. In addition, distances of the first engaging section 31, the second engaging section 32 and the fixing section 33 arranged in sequence from the starting point S to the ending point E are sequentially increased relative to the top edge 13 along the second direction (i.e. the X-axis direction). In the embodiment, the first engaging section 31, the second engaging section 32 and the fixing section 33 are in communication with each other, and arranged for example relative to a line horizontally inclined at an angle θ. Preferably but not exclusively, the angle θ is ranged from 30° to 60°. Notably, the grounded wire 20 is led out from the printed circuit board 22 between the first direction (i.e. the Z-axis direction) and the second direction (i.e. the X-axis direction). The curved path P of the hanging groove 30 is designed to include a plurality of sections, such as the first engaging section 31, the second engaging section 32 and the fixing section 33 arranged therein. Moreover, the inclined direction of the curved path P from the starting point S to the ending point E is designed according to the hanging direction of the grounded wire 20, so as to ensure that the grounded wire 20 meets the hanging requirements, keep the grounded wire 20 stable, and prevent the grounded wire 20 from falling off at the same time. In addition, since the hanging groove 30 is disposed on the recessed portion 34 outside the housing 10, when the grounded wire 20 is fixed to the hanging groove 30, the end 21 of the grounded wire 20 is exposed to the exterior of the housing 10 through the hanging groove 30. It is convenient to confirm the hanging status of the grounded wire 20 and the housing 10. Moreover, in the embodiment, the first engaging section 31 has a first spaced distance d1, the second engaging section 32 has a second spaced distance d2, and the fixing section 33 has a third spaced distance d3. In order to ensure that the grounded wire 20 is smoothly hung on the hanging groove 30 and fixed in the fixing section 33 and prevent the grounded wire 20 from falling off, the first spaced distance d1 and the second spaced distance d2 are 0.8 mm, respectively, greater than the third spaced distance d3 of 0.6 mm. Preferably but not exclusively, in the embodiment, the grounded wire 20 has a wire diameter D of 1 mm, and the wire diameter D is greater than each of the first spaced distance d1, the second spaced distance d2 and the third spaced distance d3. Thus, the design of the hanging groove 30 is helpful of ensuring that the grounded wire 20 meets the hanging requirements, keeping the grounded wire 20 stable, and preventing the grounded wire 20 from falling off at the same time.

In the embodiment, the housing 10 further includes a top cover 40 spatially corresponding to the opening 110 and the top edge 13. Preferably but not exclusively, the housing 10 includes a first engagement element 15, and the top cover 40 includes a second engagement element 42. The first engagement element 15 and the second engagement element 42 are spatially corresponding to each other. When the first engagement element 15 is engaged with the second engagement element 42, the top cover 40 is fastened on the housing 10 and covers the opening 110 and the top edge 13, the end 21 of the grounded wire 20 exposed to the recessed portion 34 through the fixing section 33 of the hanging groove 30 is at least partially exposed and uncovered by the corresponding lateral wall 41 of top cover 40, as shown in FIG. 4. It is convenient to confirm the hanging status of the grounded wire 20 and the housing 10 of the grounded structure 1.

Figure 6:
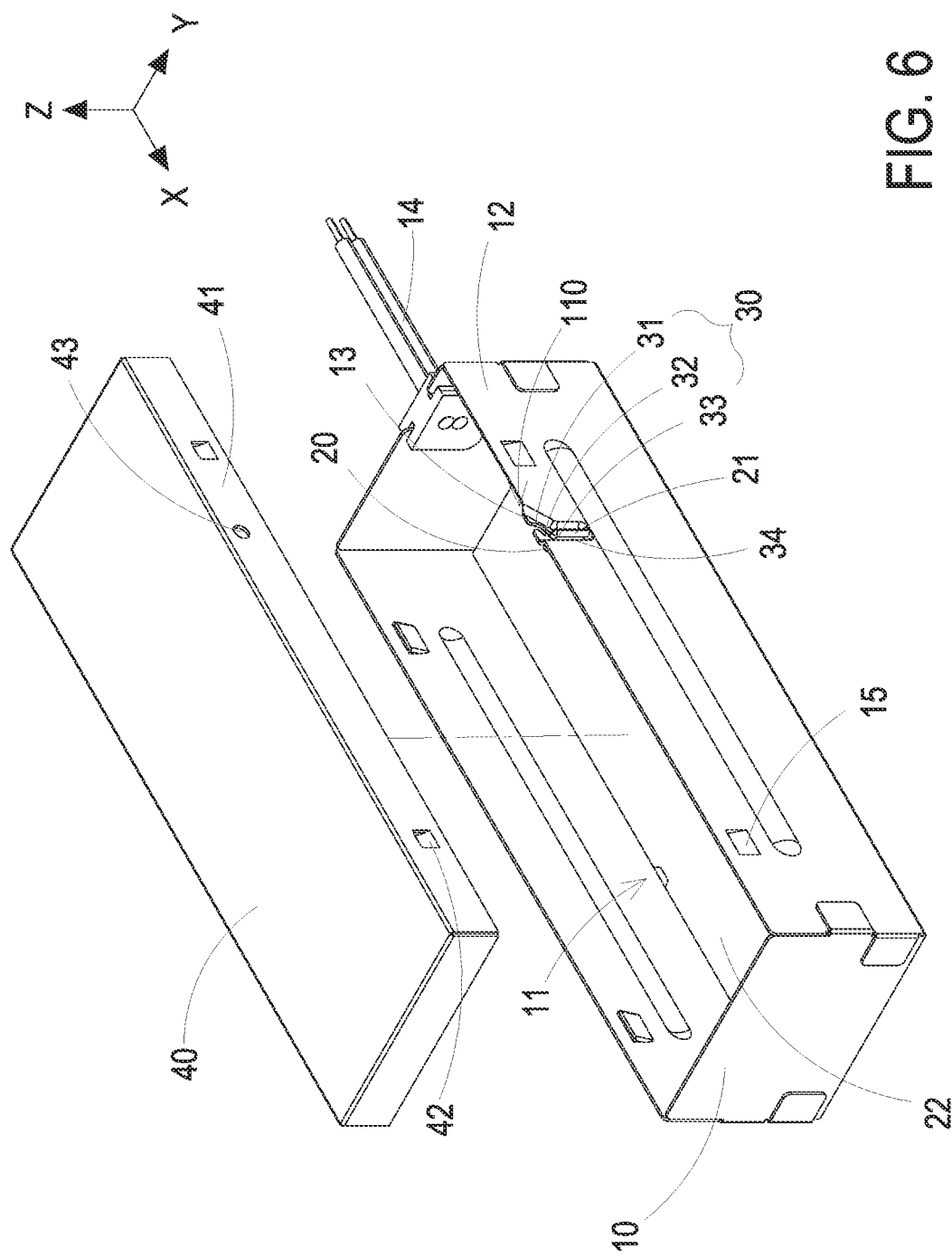
FIG. 6 is an exploded view illustrating a hanging grounded structure according to a second embodiment of the present disclosure.
Figure 7:
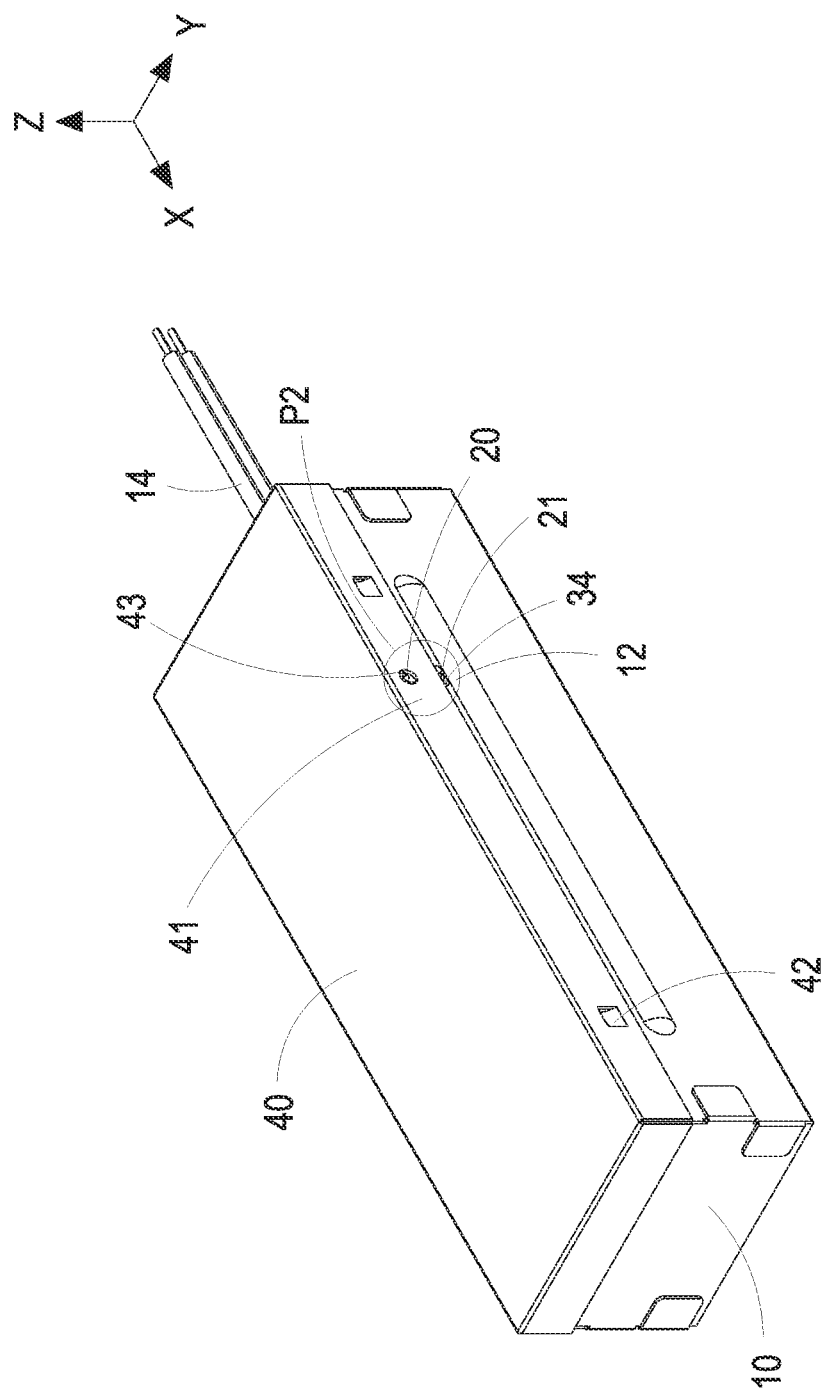
FIG. 7 is a schematic structural view illustrating the hanging grounded structure according to the second embodiment of the present disclosure.
Figure 8:
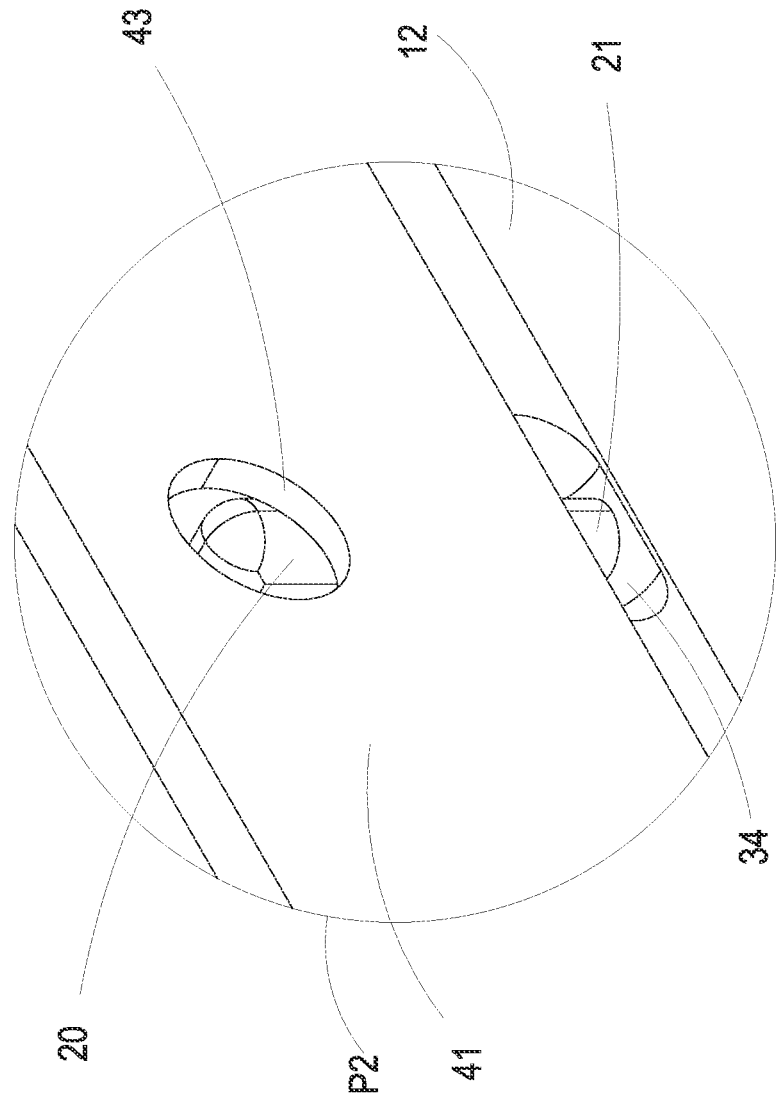
FIG. 8 is an enlarged view of the region P2 in FIG. 7.

FIG. 6 is an exploded view illustrating a hanging grounded structure according to a second embodiment of the present disclosure. FIG. 7 is a schematic structural view illustrating the hanging grounded structure according to the second embodiment of the present disclosure. FIG. 8 is an enlarged view of the region P2 in FIG. 7. In the embodiment, the structures, elements and functions of the grounded structure 1a are similar to those of the grounded structure 1 of FIGS. 1 to 5, and are not redundantly described herein. In the embodiment, the top cover 40 further includes a through hole 43 disposed on a lateral wall 41 of the top cover 40 and spatially corresponding to the hanging groove 30. When the top cover 40 covers the opening 110 and the top edge 13, the grounded wire 20 is partially exposed to an exterior of the cover 40 through the through hole 43. Thus, when the top cover 40 covers the opening 110 and the top edge 13, the end 21 of the grounded wire 20 passed through the fixing section 33 of the hanging groove 30 and exposed to the recessed portion 34 is at least partially exposed and uncovered by the corresponding lateral wall 41 of top cover 40, as shown in FIG. 8. It is convenient to confirm the hanging status of the grounded wire 20 and the housing 10 of the grounded structure 1a.

Figure 9:
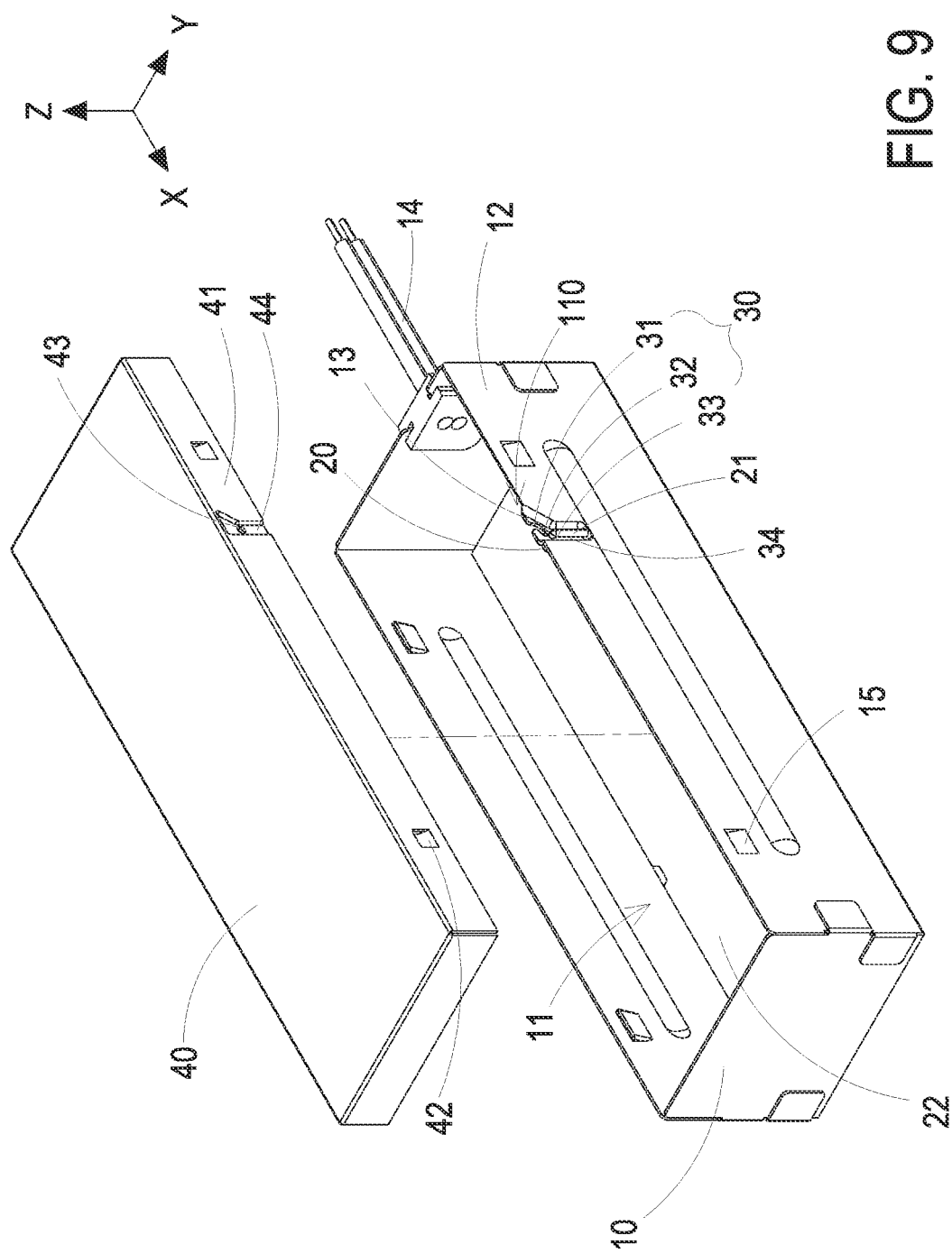
FIG. 9 is an exploded view illustrating a hanging grounded structure according to a third embodiment of the present disclosure.
Figure 10:
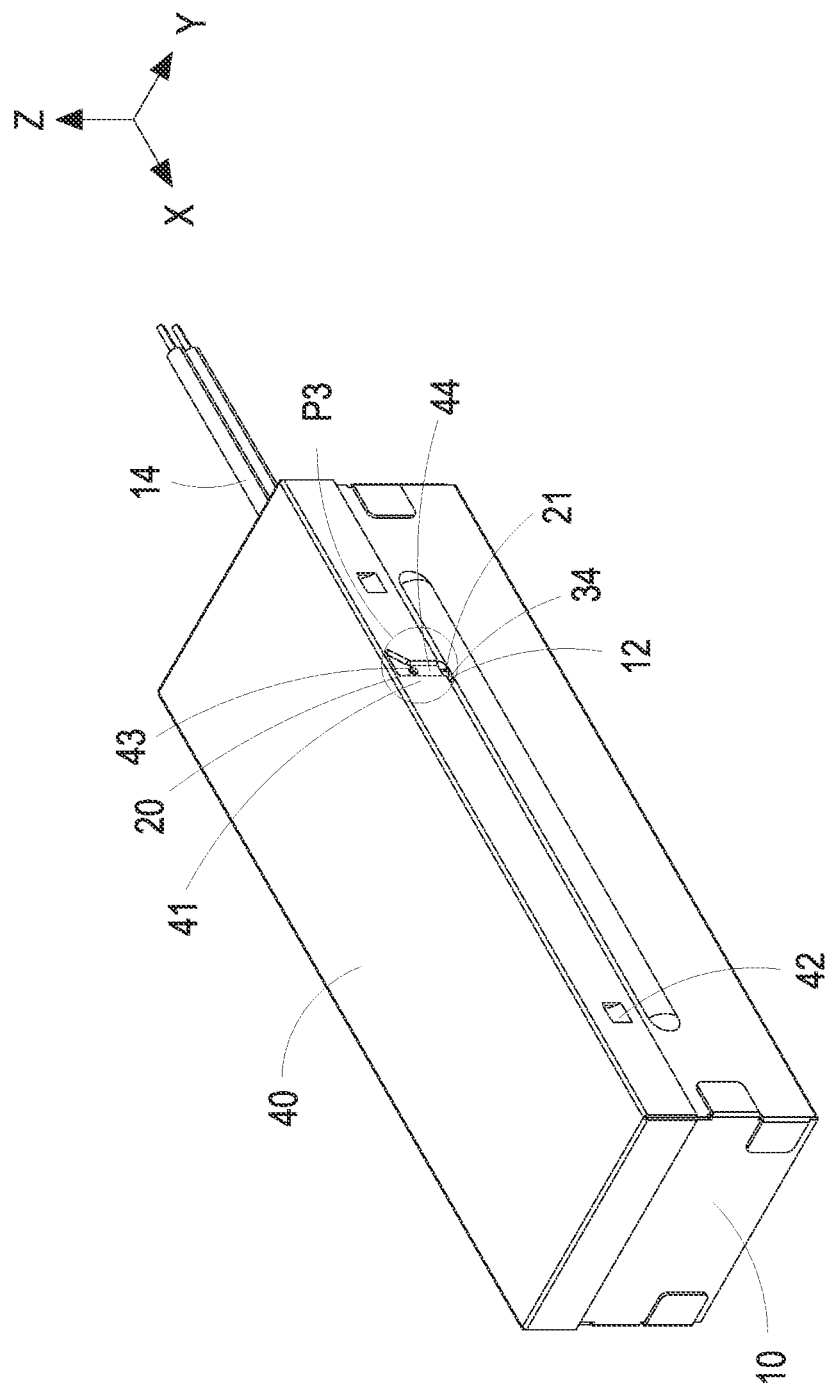
FIG. 10 is a schematic structural view illustrating the hanging grounded structure according to the third embodiment of the present disclosure.
Figure 11:
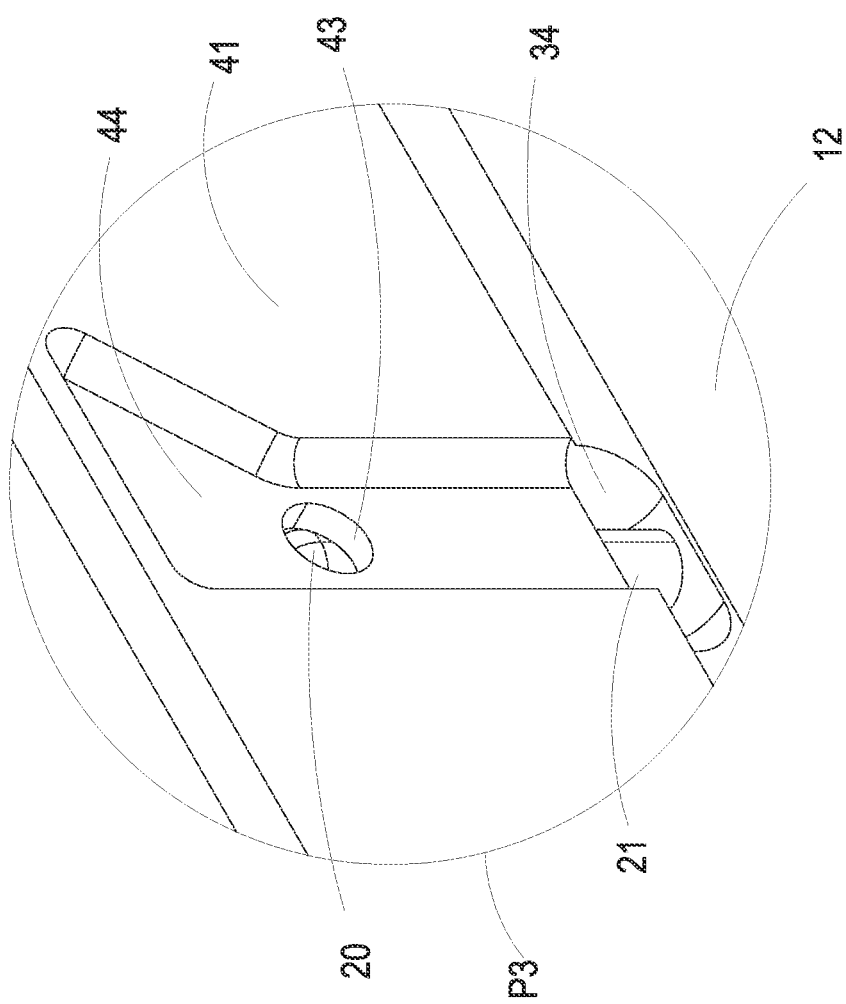
FIG. 11 is an enlarged view of the region P3 in FIG. 10.

FIG. 9 is an exploded view illustrating a hanging grounded structure according to a third embodiment of the present disclosure. FIG. 10 is a schematic structural view illustrating the hanging grounded structure according to the third embodiment of the present disclosure. FIG. 11 is an enlarged view of the region P3 in FIG. 10. In the embodiment, the structures, elements and functions of the grounded structure 1b are similar to those of the grounded structure 1 of FIGS. 1 to 5, and are not redundantly described herein. In the embodiment, the top cover 40 further includes a protrusion 44 disposed on a lateral wall 41 of the top cover 40 and spatially corresponding to the recessed portion 34 and the hanging groove 30. Preferably but not exclusively, in the embodiment, the shape of the protrusion 44 is corresponding to the shape of the recessed portion 34. When the top cover 40 is fastened to the housing 10 through the first engagement element 15 and the second engagement element 42, the protrusion 44 is slid into the recessed portion 34, so as to match with each other. When the top cover 40 covers the opening 110 and the top edge 12, the protrusion 44 abuts the end 21 of the grounded wire 20 passed through the fixing section 33 and exposed to the recessed portion 34. In other words, the protrusion 44 and the recessed portion 34 are paired with each other to clamp and fasten the end 21 of the ground wire 20, so as to ensure that the grounded wire 20 passed through the fixing section 33 and exposed to the recessed portion 34 is limited and clamped in the recessed portion 34, keep the grounded wire 20 stable, and prevent the grounded wire 20 from falling off at the same time. In the embodiment, the top cover 40 includes a through hole 43 disposed on the lateral wall 41 of the top cover 40 and passed through the protrusion 44. When the top cover 40 covers the opening 110 and the top edge 13, the grounded wire 20 is partially exposed to the exterior of the cover 40 through the through hole 43, as shown in FIG. 11. It is convenient to confirm the hanging status of the grounded wire 20 and the housing 10 of the grounded structure 1*b*.

Figure 12:
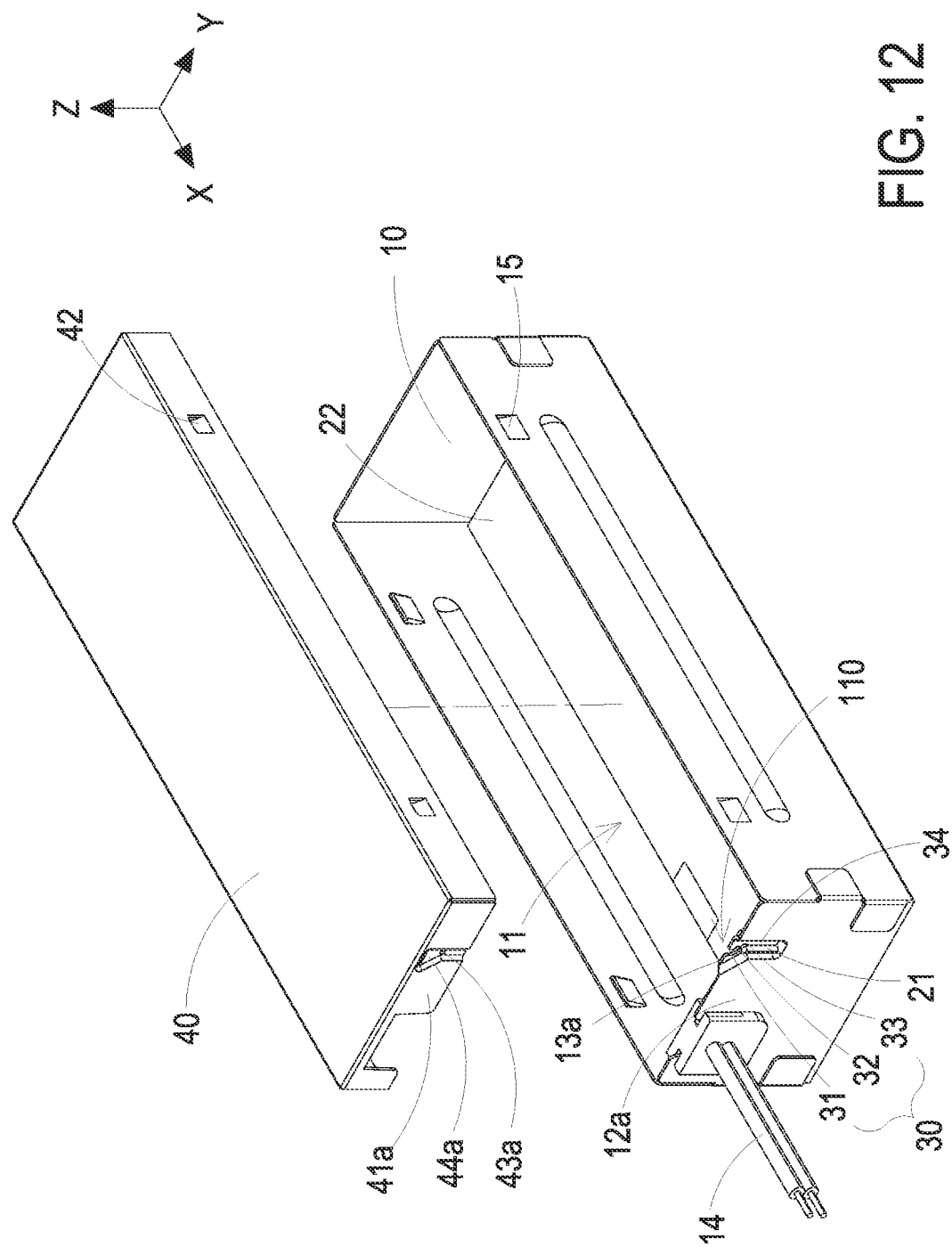
FIG. 12 is an exploded view illustrating a hanging grounded structure according to a fourth embodiment of the present disclosure.
Figure 13:
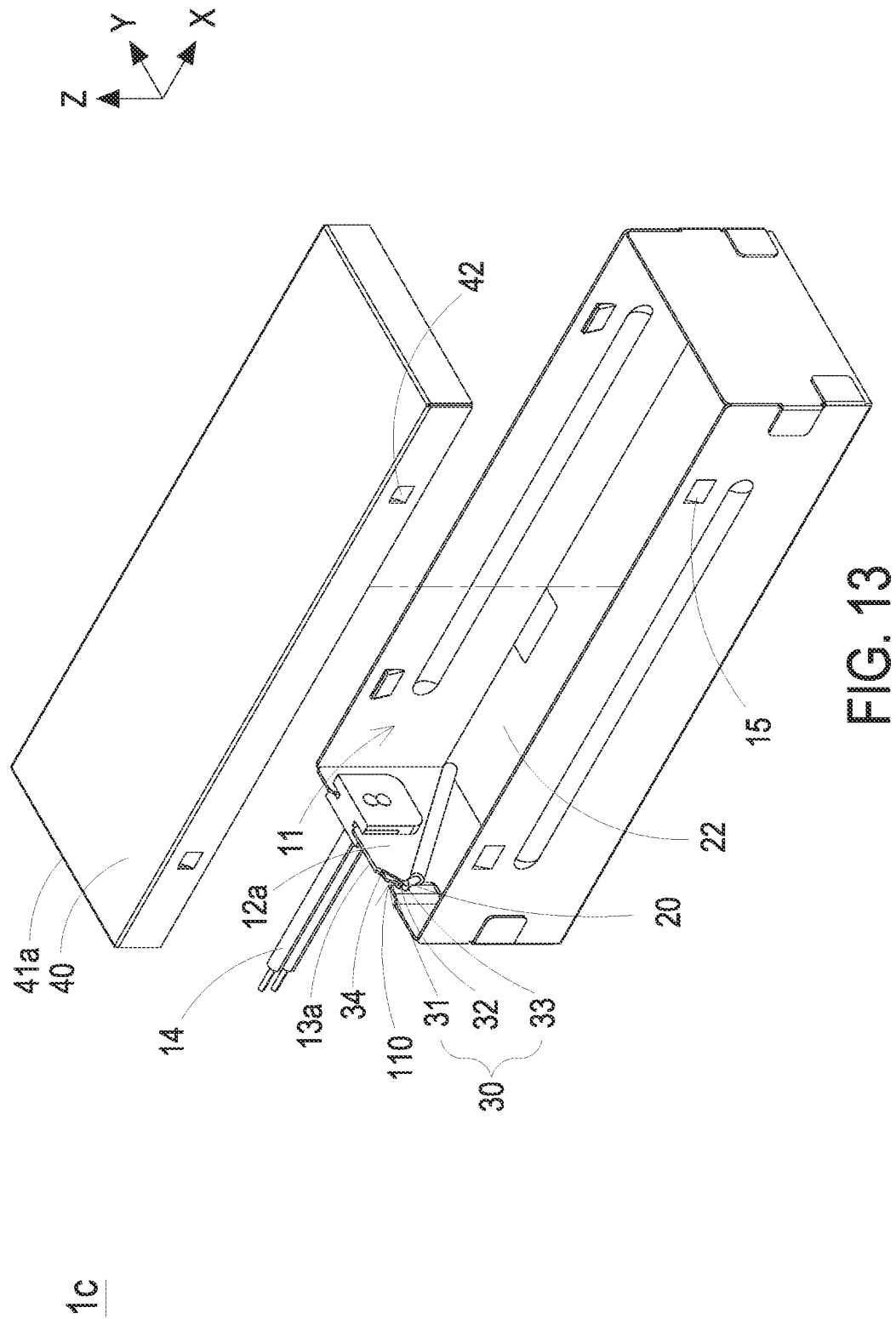
FIG. 13 is an exploded view illustrating the hanging grounded structure according to the fourth embodiment of the present disclosure and taken from another perspective.
Figure 14:
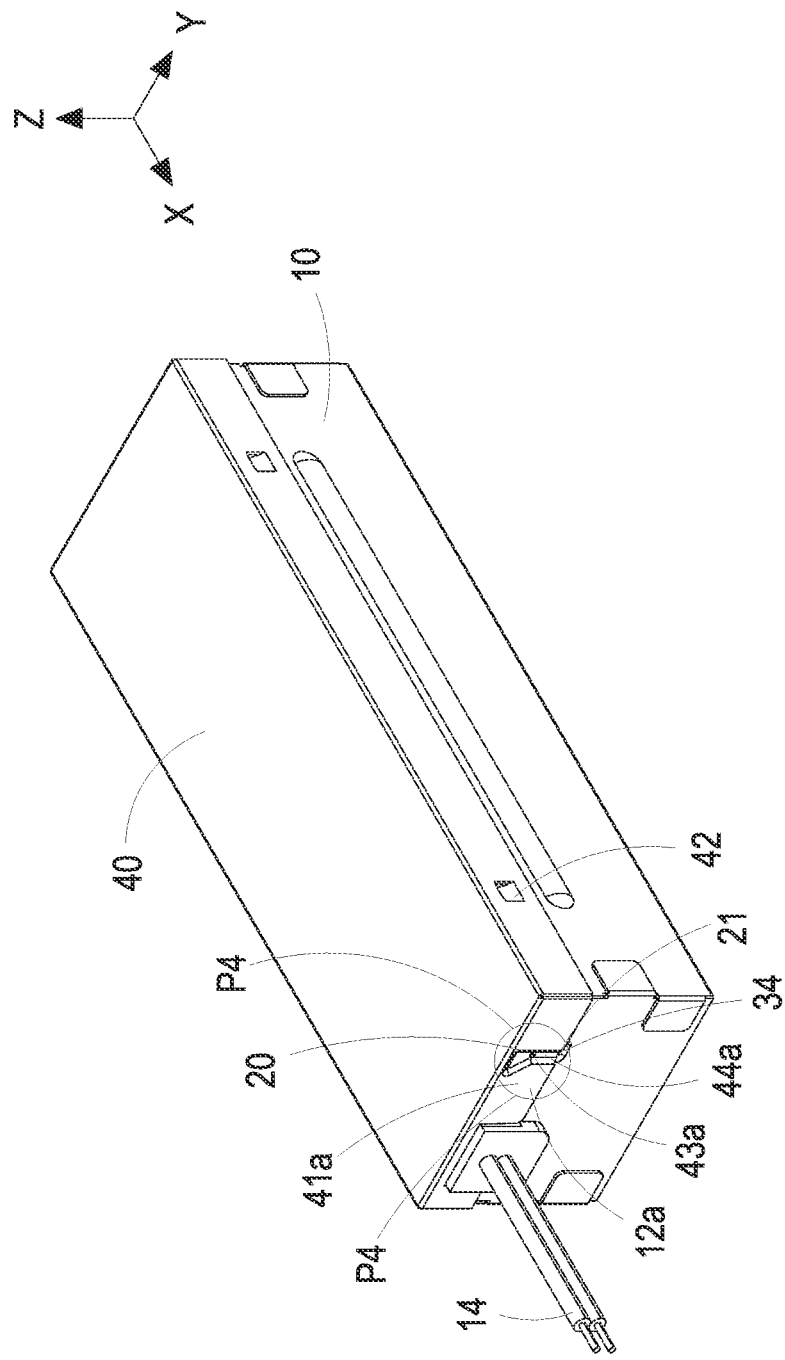
FIG. 14 is a schematic structural view illustrating the hanging grounded structure according to the fourth embodiment of the present disclosure.
Figure 15:
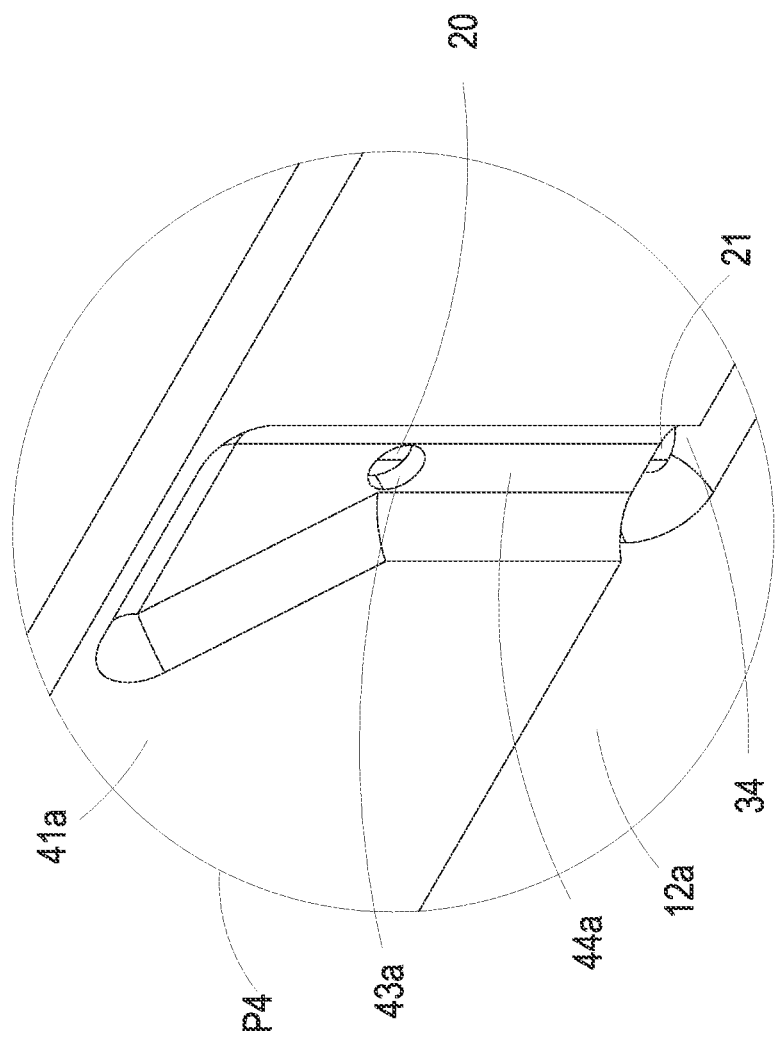
FIG. 15 is an enlarged view of the region P4 in FIG. 14.

FIGS. 12 and 13 are exploded views illustrating a hanging grounded structure according to a fourth embodiment of the present disclosure. FIG. 14 is a schematic structural view illustrating the hanging grounded structure according to the fourth embodiment of the present disclosure. FIG. 15 is an enlarged view of the region P4 in FIG. 14. In the embodiment, the structures, elements and functions of the grounded structure 1*c* are similar to those of the grounded structure 1 of FIGS. 1 to 5, and are not redundantly described herein. Different from the hanging groove 30 disposed on the longer lateral wall 12 in the first embodiment, in the embodiment, the hanging groove 30 is disposed on the short lateral wall 12*a*. The lateral wall 12*a* is extended along a second direction, for example the Y-axis direction. The first direction and the second direction are perpendicular to each other. In the embodiment, the lateral wall 12*a* has a top edge 13*a*, and the top edge 13*a* is located at a periphery of the opening 110. The recessed portion 34 is recessed inwardly from the housing 10 and disposed on the lateral wall 12*a* and the top edge 13*a*. The hanging groove 30 is disposed on the lateral wall 12*a* and located in the recessed portion 34. The hanging groove 30 is configured to hang a grounded wire 20 led out from the printed circuit board 22, so as to form the grounded structure 1*c*. In the embodiment, the hanging groove 30 includes a starting point S and an ending point E, the starting point S is located at a position of the top edge 13*a*, and a curved path P is formed from the starting point S to the ending point E. In the embodiment, the curved path P of the hanging groove 30 includes a first engaging section 31, a second engaging section 32 and a fixing section 33 arranged in sequence from the starting point S to the ending point E. The opening 110 located at the top edge 13*a* is in communication with the fixing section 33 through the first engaging section 31 and the second engaging section 32. The first engaging section 31, the second engaging section 32 and the fixing section 33 are misaligned in the first direction (i.e. the Z-axis direction) and in the second direction (i.e. the Y-axis direction). That is, the hanging groove 30 is slant compared to the top edge 13*a* of the lateral wall 12*a* in the first direction (i.e. the Z-axis direction) and the second direction (i.e. the Y-axis direction), but not perpendicular to the Z-axis direction or the Y-axis direction. In the embodiment, the grounded wire 20 is hung on the fixing section 33 of the hanging groove 30 from the interior of the housing 10, and the end 21 of the grounded wire 20 is exposed to the exterior of the recessed portion 34 through the fixing section 33 of the hanging groove 30. It is convenient to confirm the hanging status of the grounded wire 20 and the housing 10 of the grounded structure 1*c*.

In the embodiment, the top cover 40 further includes a protrusion 44*a* disposed on a shorter lateral wall 41*a* of the top cover 40 and spatially corresponding to the recessed portion 34 and the hanging groove 30. When the top cover 40 covers the opening 110 and the top edge 13, the protrusion 44*a* abuts the end 21 of the grounded wire 20 passed through the fixing section 33 and exposed to the recessed portion 34, so as to ensure that the grounded wire 20 passed through the fixing section 33 and exposed to the recessed portion 34 is limited and clamped in the recessed portion 34, keep the grounded wire 20 stable, and prevent the grounded wire 20 from falling off at the same time. In the embodiment, the top cover 40 further includes a through hole 43*a* disposed on the lateral wall 41*a* of the top cover 40 and passed through the protrusion 44*a*. When the top cover 40 covers the opening 110 and the top edge 13, the grounded wire 20 is partially exposed to the exterior of the cover 40 through the through hole 43*a*, as shown in FIG. 15. It is convenient to confirm the hanging status of the grounded wire 20 and the housing 10 of the grounded structure 1*c*.

Figure 16:
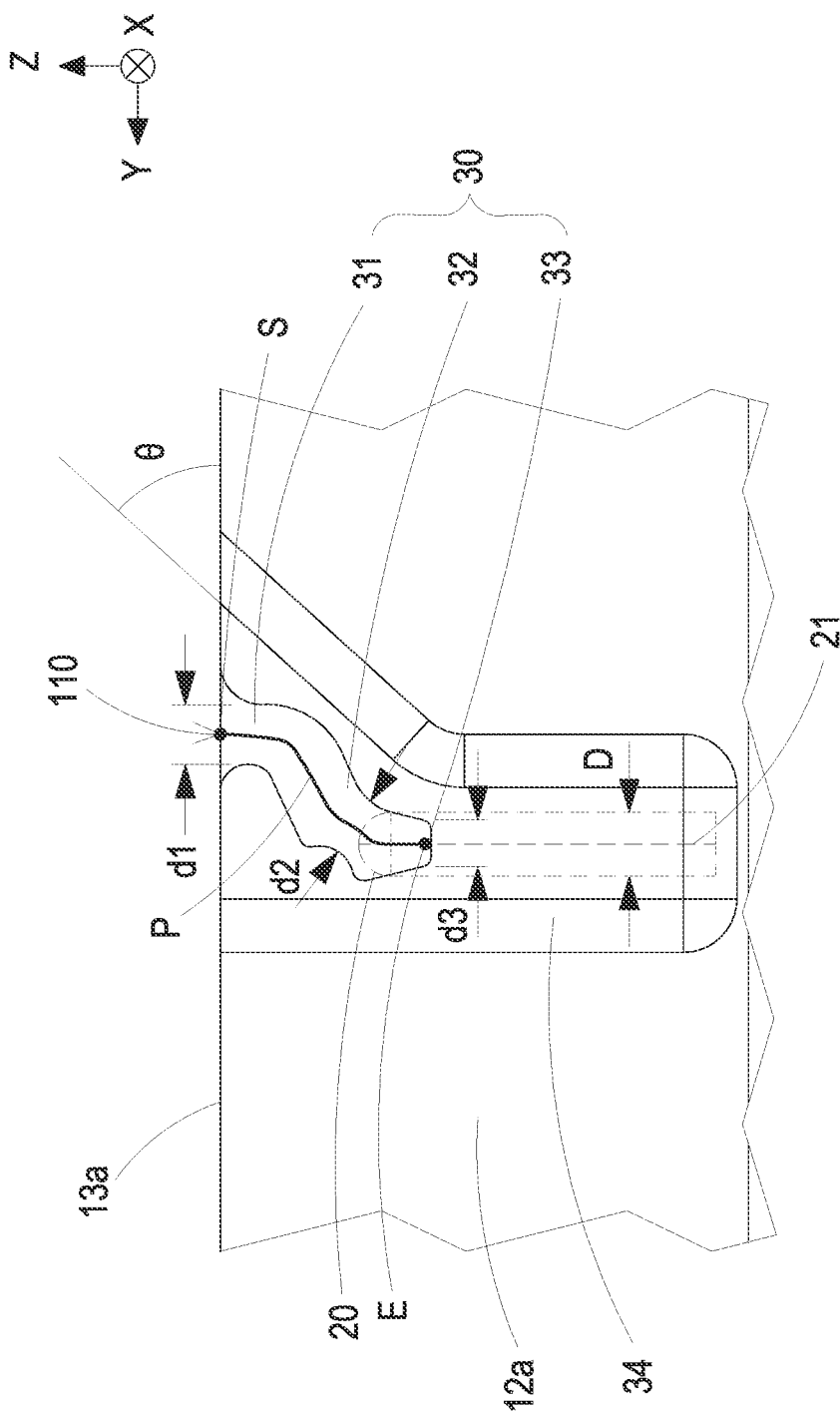
FIG. 16 is a schematic diagram showing the relative sizes of the three sections of the hanging groove of the hanging grounded structure according to the fourth embodiment of the present disclosure.

FIG. 16 is a schematic diagram showing the relative sizes of the three sections of the hanging groove of the hanging grounded structure according to the fourth embodiment of the present disclosure. As shown in FIGS. 12 to 16, the hanging groove 30 is slant compared to the top edge 13*a* of the lateral wall 12*a* of the housing 10 in the first direction such as the Z-axis direction and the second direction such as the Y-axis direction. In addition, distances of the first engaging section 31, the second engaging section 32 and the fixing section 33 arranged in sequence from the starting point S to the ending point E are sequentially increased relative to the top edge 13*a* along the second direction (i.e. the Y-axis direction). In the embodiment, the first engaging section 31, the second engaging section 32 and the fixing section 33 are in communication with each other, and arranged for example relative to a line horizontally inclined at an angle θ. Preferably but not exclusively, the angle θ is ranged from 30° to 60°. Notably, the grounded wire 20 is led out from the printed circuit board 22 between the first direction (i.e. the Z-axis direction) and the second direction (i.e. the Y-axis direction). The curved path P of the hanging groove 30 is designed to include a plurality of sections, such as the first engaging section 31, the second engaging section 32 and the fixing section 33 arranged therein. Moreover, the inclined direction of the curved path P from the starting point S to the ending point E is designed according to the hanging direction of the grounded wire 20, so as to ensure that the grounded wire 20 meets the hanging requirements, keep the grounded wire 20 stable, and prevent the grounded wire 20 from falling off at the same time. In addition, since the hanging groove 30 is disposed on the recessed portion 34 outside the housing 10, when the grounded wire 20 is fixed to the hanging groove 30, the end 21 of the grounded wire 20 is exposed to the exterior of the housing 10 through the hanging groove 30. It is convenient to confirm the hanging status of the grounded wire 20 and the housing 10. Moreover, in the embodiment, the first engaging section 31 has a first spaced distance d1, the second engaging section 32 has a second spaced distance d2, and the fixing section 33 has a third spaced distance d3. In order to ensure that the grounded wire 20 is smoothly hung on the hanging groove 30 and fixed in the fixing section 33 and prevent the grounded wire 20 from falling off, the first spaced distance d1 and the second spaced distance d2 are 0.8 mm, respectively, greater than the third spaced distance d3 of 0.6 mm. Preferably but not exclusively, in the embodiment, the grounded wire 20 has a wire diameter D of 1 mm, and the wire diameter D is greater than each of the first spaced distance d1, the second spaced distance d2 and the third spaced distance d3. Thus, the design of the hanging groove 30 is helpful of ensuring that the grounded wire 20 meets the hanging requirements, keeping the grounded wire 20 stable, and preventing the grounded wire 20 from falling off at the same time.

In summary, the present disclosure provides a hanging grounded structure. With the hanging groove disposed in a slant arrangement, the procedure of hanging the grounded wire to the housing is simplified. The hanging groove is designed to include a plurality of sections in a curved path from the starting point to the ending point, and the slant direction is designed according to the hanging direction of the grounded wire, so as to ensure that the grounded wire meets the hanging requirements, keep the grounded wire stable, and prevent the grounded wire from falling off. In addition, the hanging groove is located in the recessed portion outside the housing, and forms the curved path from the starting point to the ending point. When the grounded wire is fixed to the hanging groove, an end of the grounded wire is exposed to an exterior of the housing through the hanging groove. It is convenient to confirm the hanging status of the grounded wire and the housing. On the other hand, after the top cover of the housing is assembled, the end of the grounded wire exposed to the recessed portion through the fixing section is at least partially exposed and uncovered by the top cover. The top cover includes a through hole spatially corresponding to the hanging groove. It is convenient for confirming the hanging status of the grounded wire and the housing. In addition, the top cover further includes a protrusion spatially corresponding to the hanging groove and the recessed portion, so that when the top cover of the housing is assembled, the protrusion abuts against the grounded wire in the recessed portion to ensure that the ground wire is limited and clamped in the recessed portion, keep the grounded wire stable, and prevent the grounded wire from falling off.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A hanging grounded structure, comprising:
   a housing comprising an opening and a lateral wall, wherein the opening faces a first direction, the lateral wall is extended along a second direction, and the first direction and the second direction are perpendicular to each other, wherein the lateral wall has a top edge located at a periphery of the opening;
   a recessed portion recessed inwardly from the housing and disposed on the lateral wall; and
   a hanging groove disposed on the lateral wall and located in the recessed portion, wherein a grounded wire is allowed to be hung on the housing through the hanging groove, wherein the hanging groove comprises a starting point and an ending point, the starting point is located at a position of the top edge, and a curved path is formed from the starting point to the ending point, wherein the grounded wire is hung on the hanging groove from an interior of the housing, and an end of the grounded wire is disposed in the recessed portion through the hanging groove.

2. The hanging grounded structure according to claim 1, wherein the housing comprises an accommodation space, the accommodation space is configured to receive a printed circuit board, the accommodation space is in communication with an exterior of the housing through the opening and the hanging groove, and a fixed end of the grounded wire is connected to the printed circuit board.

3. The hanging grounded structure according to claim 1, wherein the hanging groove is slant compared to the top edge in the first direction and the second direction.

4. The hanging grounded structure according to claim 1, wherein the curved path of the hanging groove comprises a first engaging section, a second engaging section and a fixing section arranged in sequence from the starting point to the ending point, wherein distances of the first engaging section, the second engaging section and the fixing section are sequentially increased relative to the top edge along the second direction.

5. The hanging grounded structure according to claim 4, wherein the first engaging section has a first spaced distance, the second engaging section has a second spaced distance, and the fixing section has a third spaced distance, wherein the first spaced distance and the second spaced distance are greater than the third spaced distance, respectively, wherein the grounded wire has a wire diameter, and the wire diameter is greater than each of the first spaced distance, the second spaced distance and the third spaced distance.

6. The hanging grounded structure according to claim 1, wherein the housing further comprises a top cover spatially corresponding to the opening and the top edge, wherein when the top cover covers the opening and the top edge, the end of the grounded wire passed through the hanging groove and exposed to the recessed portion is at least partially exposed and uncovered by the top cover.

7. The hanging grounded structure according to claim 6, wherein the top cover further comprises a through hole disposed on a lateral wall of the top cover and spatially corresponding to the hanging groove, wherein when the top cover covers the opening and the top edge, the grounded wire is partially exposed to an exterior of the cover through the through hole.

8. The hanging grounded structure according to claim 6, wherein the top cover further comprises a protrusion disposed on a lateral wall of the top cover and spatially corresponding to the recessed portion and the hanging groove, wherein when the top cover covers the opening and the top edge, the protrusion abuts the end of the grounded wire passed through the hanging groove and exposed to the recessed portion.

9. The hanging grounded structure according to claim 6, wherein the housing comprises a first engagement element, the top cover comprises a second engagement element, and the first engagement element and the second engagement element are spatially corresponding to each other, wherein when the first engagement element is engaged with the second engagement element, the top cover is fastened on the housing.

10. A hanging grounded structure, comprising:
    a housing comprising an opening and a lateral wall, wherein the opening faces a first direction, the lateral wall is extended along a second direction, and the first direction and the second direction are perpendicular to each other, wherein the lateral wall has a top edge located at a periphery of the opening;
    a recessed portion recessed inwardly from the housing and disposed on the lateral wall; and
    a hanging groove disposed on the lateral wall and located in the recessed portion, wherein a grounded wire is allowed to be hung on the housing through the hanging groove, wherein the hanging groove is slant compared to the top edge in the first direction and in the second direction, and an end of the grounded wire is exposed to an exterior of the housing through the hanging groove.

11. The hanging grounded structure according to claim 10, wherein the housing comprises an accommodation space, the accommodation space is configured to receive a printed circuit board, the accommodation space is in communication with an exterior of the housing through the opening and the hanging groove, and a fixed end of the grounded wire is connected to the printed circuit board.

12. The hanging grounded structure according to claim 10, wherein the hanging groove comprises a starting point and an ending point, the starting point is located at a position of the top edge, and a curved path is formed from the starting point to the ending point, wherein the curved path of the hanging groove comprises a first engaging section, a second engaging section and a fixing section arranged in sequence from the starting point to the ending point, and the opening located at the top edge is in communication with the fixing section through the first engaging section and the second engaging section, wherein the first engaging section, the second engaging section and the fixing section are misaligned in the first direction and in the second direction, wherein the grounded wire is hung on the fixing section from an interior of the housing, and the end of the grounded wire is exposed through the fixing section.

13. The hanging grounded structure according to claim 12, wherein distances of the first engaging section, the second engaging section and the fixing section are sequentially increased relative to the top edge along the second direction.

14. The hanging grounded structure according to claim 12, wherein the housing further comprises a top cover spatially corresponding to the opening and the top edge, wherein when the top cover covers the opening and the top edge, the end of the grounded wire exposed to the recessed portion through the fixing section is at least partially exposed and uncovered by the top cover.

15. The hanging grounded structure according to claim 14, wherein the top cover further comprises a through hole disposed on a lateral wall of the top cover and spatially corresponding to the hanging groove, wherein when the top cover covers the opening and the top edge, the grounded wire is partially exposed to an exterior of the cover through the through hole.

16. The hanging grounded structure according to claim 14, wherein the top cover further comprises a protrusion disposed on a lateral wall of the top cover and spatially corresponding to the recessed portion and the hanging groove, wherein when the top cover covers the opening and the top edge, the protrusion abuts the end of the grounded wire passed through the fixing section and exposed to the recessed portion.

17. The hanging grounded structure according to claim 14, wherein the housing comprises a first engagement element, the top cover comprises a second engagement element, and the first engagement element and the second engagement element are spatially corresponding to each other, wherein when the first engagement element is engaged with the second engagement element, the top cover is fastened on the housing.

18. The hanging grounded structure according to claim 12, wherein the first engaging section has a first spaced distance, the second engaging section has a second spaced distance, and the fixing section has a third spaced distance, wherein the first spaced distance and the second spaced distance are greater than the third spaced distance, respectively, wherein the grounded wire has a wire diameter, and the wire diameter is greater than each of the first spaced distance, the second spaced distance and the third spaced distance.

* * * * *